United States Patent
Tomita

(10) Patent No.: US 7,720,238 B2
(45) Date of Patent: May 18, 2010

(54) VIDEO-AUDIO OUTPUT DEVICE AND VIDEO/AUDIO METHOD

(75) Inventor: Go Tomita, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/341,859

(22) Filed: Dec. 22, 2008

(65) Prior Publication Data

US 2009/0245538 A1    Oct. 1, 2009

(30) Foreign Application Priority Data

Mar. 31, 2008    (JP) .............................. 2008-091729

(51) Int. Cl.
   *H03G 3/00*    (2006.01)
(52) U.S. Cl. ...................... 381/107; 381/102; 348/484; 348/473
(58) Field of Classification Search ................. 381/107, 381/104, 333, 386, 150, 388, 102, 109, 108; 348/707, 484, E5.042, 473
   See application file for complete search history.

(56) References Cited

U.S. PATENT DOCUMENTS

| 2005/0111675 | A1* | 5/2005 | Lee ............................. 381/104 |
| 2006/0171565 | A1* | 8/2006 | Takahashi ................... 382/105 |
| 2007/0077020 | A1 | 4/2007 | Takahama |
| 2008/0309830 | A1* | 12/2008 | Motomura ................... 348/738 |
| 2009/0046210 | A1* | 2/2009 | Sakamoto et al. ........... 348/738 |
| 2009/0051825 | A1 | 2/2009 | Asayama et al. |
| 2009/0141170 | A1 | 6/2009 | Asayama et al. |
| 2009/0262256 | A1* | 10/2009 | Asayama et al. ............ 348/738 |

FOREIGN PATENT DOCUMENTS

| JP | 7030828 | 1/1995 |
| JP | 11239310 | 8/1999 |
| JP | 2001359017 | 12/2001 |
| JP | 2003298975 | 10/2003 |
| JP | 2006-115192 | 4/2006 |
| JP | 2006339848 | 12/2006 |
| JP | 2007-104138 | 4/2007 |
| JP | 2007088774 | 4/2007 |
| JP | 2007-124552 | 5/2007 |
| JP | 2007-179077 | 7/2007 |
| JP | 2007-306444 | 11/2007 |
| JP | 2008-061251 | 3/2008 |
| WO | WO 2007072791 | 6/2007 |
| WO | 2007-040053 A1 | 12/2007 |

OTHER PUBLICATIONS

Notification of Reasons for Rejection with English translation in a corresponding Japanese application dated May 12, 2009, application No. 2008-091729.

* cited by examiner

*Primary Examiner*—Vivian Chin
*Assistant Examiner*—Con P Tran
(74) *Attorney, Agent, or Firm*—Blakely, Sokoloff, Taylor & Zafman LLP

(57) ABSTRACT

According to one embodiment, a video/audio output method according to one embodiment includes detecting a playback volume value set in an external speaker controller for controlling an external speaker, calculating a decibel value corresponding to the detected playback volume value, generating an audio signal corresponding to the calculated decibel value, and outputting the generated audio signal to the external speaker controller, and, at the same time, outputting a video based on a video signal corresponding to the audio signal.

5 Claims, 4 Drawing Sheets

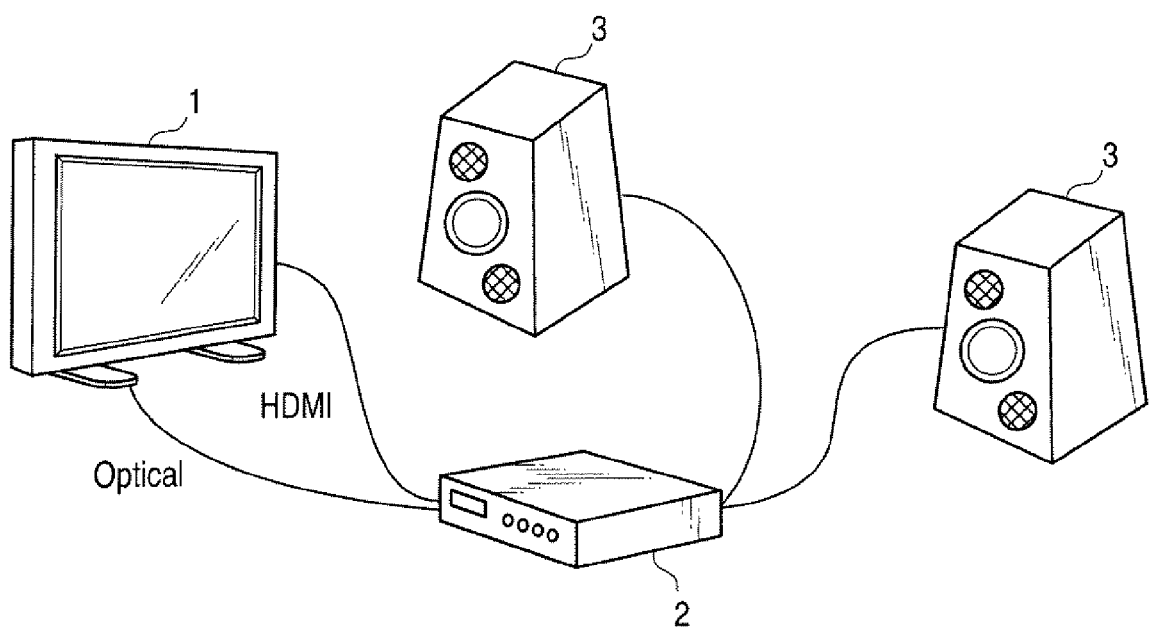
F I G. 1

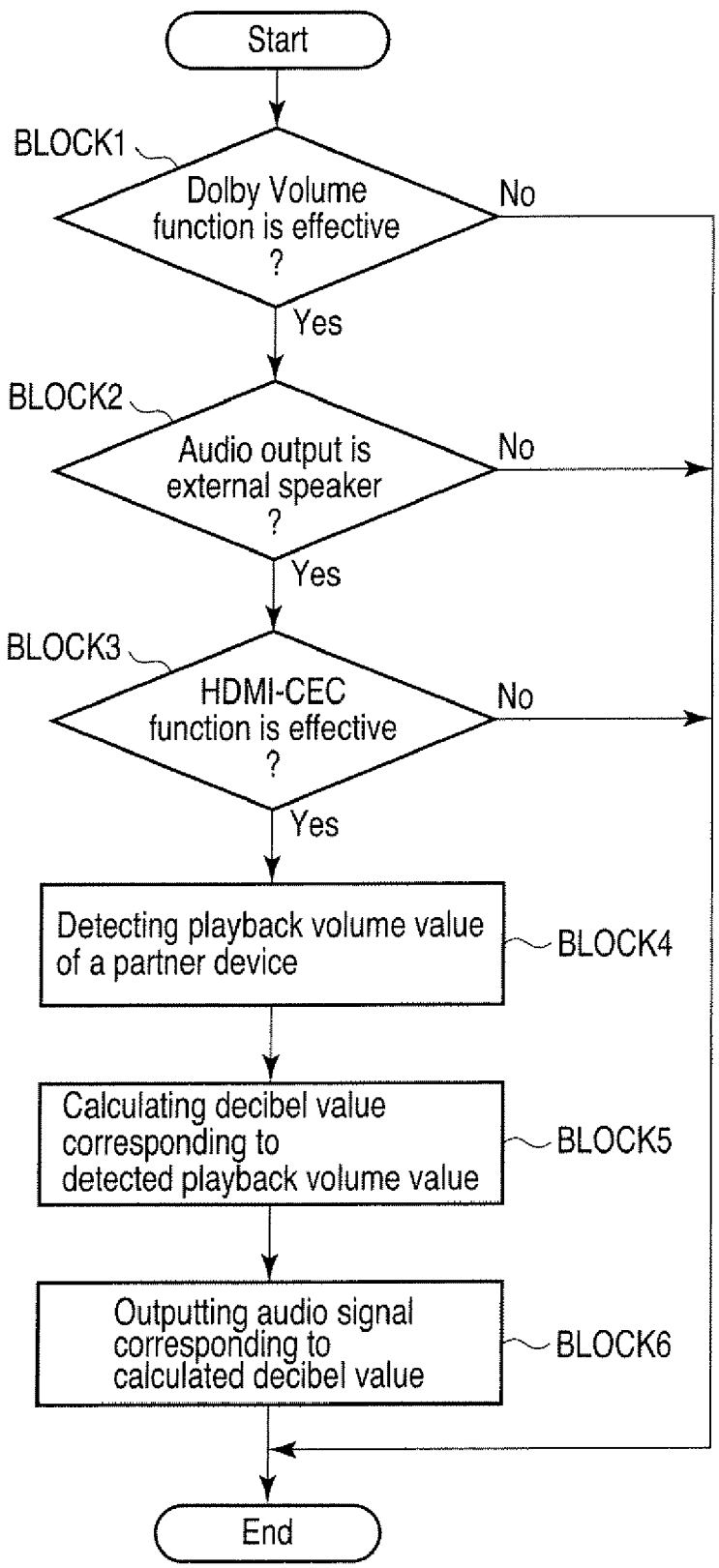
F I G. 3

VIDEO-AUDIO OUTPUT DEVICE AND VIDEO/AUDIO METHOD

CROSS-REFERENCE TO RELATED APPLICATIONS

This application is based upon and claims the benefit of priority from Japanese Patent Application No. 2008-091729, filed Mar. 31, 2008, the entire contents of which are incorporated herein by reference.

BACKGROUND

1. Field

One embodiment of the invention relates to a video/audio output device such as a TV and a video/audio output method which can be applied to the audio output equipment such as the video/audio output device.

2. Description of the Related Art

Recently, there is a widespread use of a digital equipment with an HDMI (High Definition Multimedia Interface) (TM) mounted therein, such as a TV, a DVD player, a DVD recorder, and an AV amplifier. The HDMI can transfer video and audio in an uncompressed manner. When equipments advocating compliance with HDMI-CEC (Consumer-Electronics Control), such as a TV and a DVD recorder, are connected to each other, the DVD recorder connected to the TV can be operated by use of a TV remote controller by virtue of an HDMI-CEC function.

Jpn. Pat. Appln. KOKAI Publication No. 2007-104138 discloses a technique relating to audio output control using the HDMI-CEC. Specifically, when a microcomputer of an amplifier has detected conversion from the off state to the on state of a power source, the microcomputer requests a notification of information showing whether the television connected to the amplifier is in a television mode or a theater mode from the television through an HDMI-CEC communication unit. Meanwhile, when the microcomputer of the amplifier has received, from the television, the answer that the television is in the television mode, the microcomputer performs control to prevent the output of an audio signal through an external speaker connected to the amplifier, whereby the audio signal provided from the television to the amplifier is output through an internal speaker of the television without being output through the external speaker. When the microcomputer of the amplifier has received the answer that the television is in the theater mode, the microcomputer performs control so that the audio signal is output through the external speaker connected to the amplifier, whereby the audio signal provided from the television to the amplifier is output through the external speaker without being output through the internal speaker of the television.

In addition, more recently, the Dolby Volume (TM) for correcting the difference in a television sound level has been disclosed.

The Dolby Volume has the concept of Leveler/Modeler. The Leveler and Modeler respectively have a function of eliminating a sense of incongruity due to the difference in content's volume level and a function of performing bandwidth correction in accordance with a playback volume position (audio volume). Namely, the Dolby Volume consistently provides stable volume and audio quality to various audio sources.

The Modeler in the Dolby Volume performs processing corresponding to playback volume. It is relatively easy to provide a design for obtaining the effect of the Dolby Volume for the output through the internal speaker built in a TV set. This is because the TV set includes a volume adjustment unit and a speaker output unit.

However, it is difficult to provide a design for obtaining the effect of the Dolby Volume for the output through the external speaker connected to the TV set through an external speaker controller (amplifier). This is because the TV set cannot detect the volume set in the external speaker controller.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 1 is a view showing a state that a digital television broadcasting receiving device according to an embodiment of the invention and an external speaker controller are connected to each other, and the external speaker controller and an external speaker are further connected to each other;

FIG. 3 is a flow chart for explaining expansion of a Dolby Volume function according to the embodiment.

DETAILED DESCRIPTION

Various embodiments according to the invention will be described hereinafter with reference to the accompanying drawings. In general, a video/audio output device according to one embodiment of the invention comprises: a detection module configured to detect a playback volume value set in an external speaker controller for controlling an external speaker; a calculation module configured to calculate a decibel value corresponding to the playback volume value detected by the detection module; a generation module configured to generate an audio signal corresponding to the calculated decibel value; an audio signal output module configured to output the generated audio signal to the external speaker controller; and a video output module configured to output a video based on a video signal corresponding to the audio signal.

Hereinafter, an embodiment of the invention is described with reference to drawings.

Figure 2:
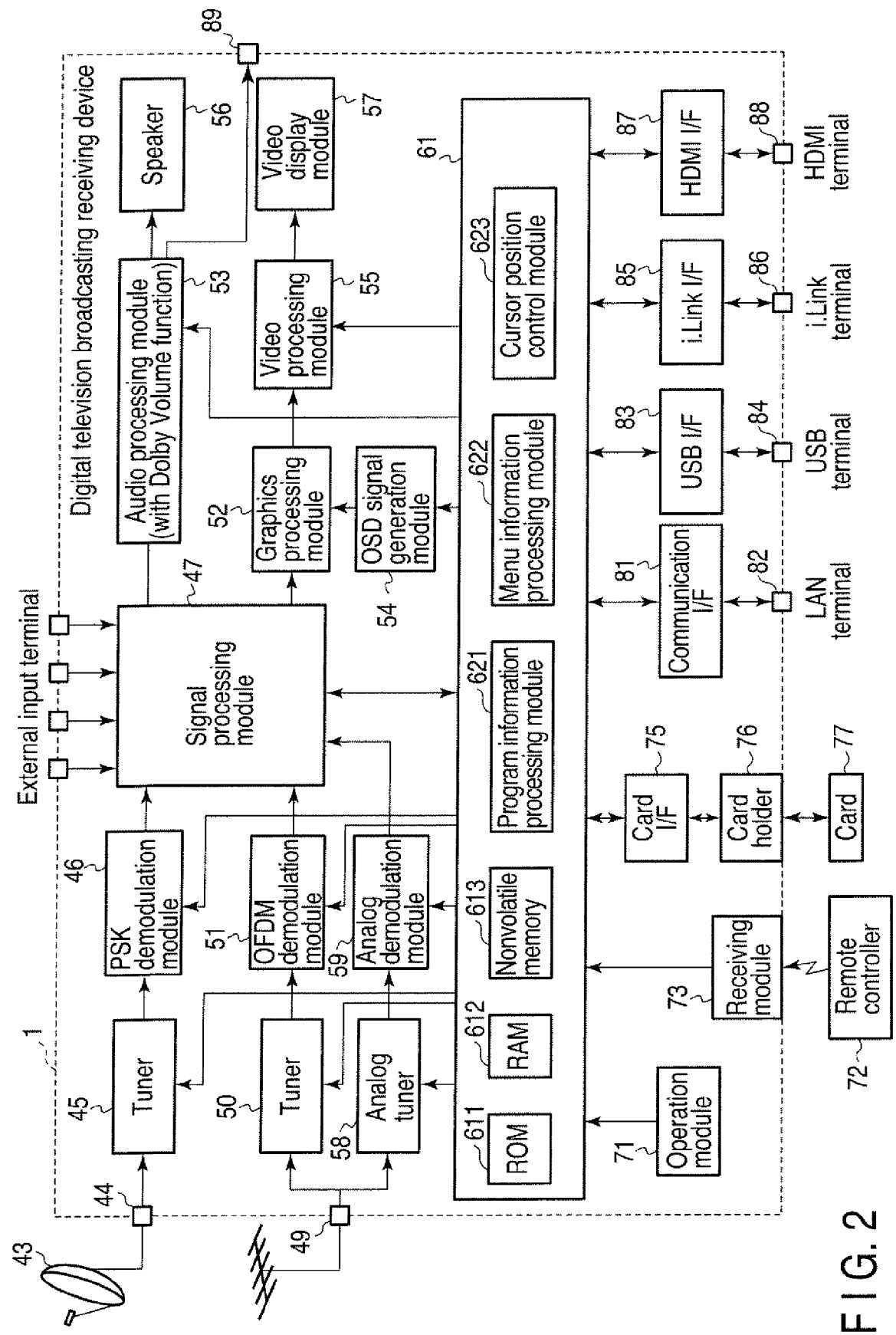
FIG. 2 is a schematic configuration diagram of the digital television broadcasting receiving device according to the embodiment of the invention.

FIG. 2 is a schematic configuration diagram of a digital television broadcasting receiving device 1 (video/audio output device) according to one embodiment of the invention. Hereinafter, the digital television broadcasting receiving device 1 is described with reference to FIG. 2.

A digital satellite television broadcasting signal received by a BS/CS digital broadcasting receiving antenna 43 is supplied to a digital satellite television broadcasting tuner 45 through an input terminal 44. The tuner 45 selects an intended channel broadcasting signal from plural channel broadcasting signals included in the received digital satellite television broadcasting signal.

The intended channel broadcasting signal selected by the tuner 45 is supplied to a PSK (Phase Shift Keying) demodulation module 46. The PSK demodulation module 46 demodulates the intended channel broadcasting signal into a digital video signal and a digital audio signal to output these video and audio signals to a signal processing module 47.

Meanwhile, a digital terrestrial television broadcasting signal received by a digital terrestrial broadcasting receiving antenna 48 is supplied to a digital terrestrial broadcasting tuner 50 through an input terminal 49. The tuner 50 selects an intended channel broadcasting signal from plural channel broadcasting signals included in the received digital terrestrial television broadcasting signal.

The intended channel broadcasting signal selected by the tuner 50 is supplied to an OFDM (Orthogonal Frequency Division Multiplexing) demodulation module 51. The OFDM demodulation module 51 demodulates the intended channel broadcasting signal into a digital video signal and a digital audio signal to output these video and audio signals to the signal processing module 47.

There is also an analog tuner 58 for an analog terrestrial television broadcasting signal. The analog tuner 58 selects an intended channel broadcasting signal from plural channel broadcasting signals included in the received analog terrestrial television broadcasting signal.

The intended channel broadcasting signal selected by the tuner 58 is supplied to an analog demodulation module 59. The analog demodulation module 59 demodulates the intended channel broadcasting signal into a video signal and an audio signal to output these video and audio signals to the signal processing module 47.

The signal processing module 47 applies a predetermined digital signal processing to the digital video signals and the digital audio signals supplied respectively from the PSK demodulation module 46 and the OFDM demodulation module 51 and the video and audio signals supplied respectively from the analog demodulation module 59 and a line input terminal to output the signals to a graphics processing module 52 and an audio processing module 53.

The graphics processing module 52 has a function of superimposing an OSD (On Screen Display) signal generated by an OSD signal generation module 54 on the digital video signal supplied from the signal processing module 47 to output the signals. The graphics processing module 52 outputs the digital output video signal from the signal processing module 47 or the digital output video signal with the OSD signal superimposed thereon to a video processing module 55.

The video processing module 55 converts a digital video signal into an analog video signal having a format which can be displayed by a video display module 57. The video display module 57 outputs a video based on the analog video signal obtained by the conversion.

The audio processing module 53 converts the digital audio signal supplied from the signal processing module 47 into an analog audio signal having a format which can be reproduced by the internal speaker 56 to output the analog audio signal to the internal speaker 56. The internal speaker 56 reproduces audio based on the analog audio signal obtained by the conversion.

Further, the audio processing module 53 has a Dolby Volume function. The audio processing module 53 generates an analog audio signal, corresponding to a designated decibel value, from the digital audio signal supplied from the signal processing module 47, using the Dolby Volume function to output the generated analog audio signal to the internal speaker 56. Or the audio processing module 53 generates a digital audio signal, corresponding to a designated decibel value, from the digital audio signal supplied from the signal processing module 47, using the Dolby Volume function to output the generated digital audio signal to an HDMI I/F (Interface) 87. The digital audio signal input into the HDMI I/F 87 is output to an external speaker controller (amplifier) 2 through an HDMI terminal 88.

A control module 61 includes a CPU (Central Processing Unit) and controls all operations including receiving, processing, and outputting of the above-mentioned broadcasting signals and HDMI-CEC. The control module 61 controls each module on the basis of operation information input from an operation module 71 or operation information from a remote controller 72 input through a receiving module 73.

The control module 61 includes a ROM (Read Only Memory) 611 in which a control program executed by the CPU is stored, a RAM (Random Access Memory) 612 providing a work area for the CPU, and a nonvolatile memory 613 in which various setting information, control information, and the like are stored.

The control module 61 is connected to a card holder 76, in which a first memory card 77 can be mounted, through a card I/F 75, whereby the control module 61 can send and receive the information to and from the first memory card 77, mounted in the card holder 76, through the card I/F 75. The control module 61 may be connected to a card holder, in which a second memory card can be mounted, through another card I/F.

Further, the control module 61 is connected to a first LAN terminal 82 through a communication I/F 81, whereby the control module 61 can send and receive the information to and from a LAN-compatible HDD (Hard Disk Drive device), connected to the first LAN terminal 82, through the communication I/F 81. The control module 61 has a DHCP (Dynamic Host Configuration Protocol) server function and allocates an IP (Internet Protocol) address to the LAN-compatible HDD, connected to the first LAN terminal 82, to control the operation of the HDD. The control module 61 may be connected to a second LAN terminal through another communication I/F.

Further, the control module 61 is connected to an USB terminal 84 through an USB I/F 83, whereby the control module 61 can send and receive the information to and from each equipment, connected to the USB terminal 84, through the USB I/F 83.

Further, the control module 61 is connected to an i.Link (TM) terminal 86 through an i.Link I/F 85, whereby the control module 61 can send and receive the information to and from each equipment, connected to the i.Link terminal 86, through the i.Link I/F 85.

Further, the control module 61 can send and receive the information to and from each equipment, connected to an HDMI terminal 88 through an HDMI I/F 87 meeting the HDMI (High Definition Multimedia Interface) specification.

The control module 61 has a program information processing module 621 for processing electronic program information and a menu information processing module 622 for processing menu information. The control module 61 further has a cursor position control module 623. The cursor position control module 623 controls the operation of a cursor in response to a user's cursor operation through the remote controller 72.

Each control function of the control module 61 may be realized by software.

Next, with reference to FIG. 1, hereinafter it will be described the case in which the digital television broadcasting receiving device 1 and the external speaker controller 2 (amplifier) are connected to each other, and the external speaker controller 2 and the external speaker 3 are connected to each other. More specifically, the digital television broadcasting receiving device 1 and the external speaker controller 2 are connected through the respective HDMI terminals. Further, the digital television broadcasting receiving device 1 and the external speaker controller 2 are connected with an optical cable or a pin cable through an audio output terminal 89. The audio signal output from the digital television broadcasting receiving device 1 is input into the external speaker controller 2 through the optical cable (linear PCM output) or the pin cable.

As described above, the digital television broadcasting receiving device 1 has the HDMI terminal and corresponds to the HDMI-CEC and the Dolby Volume. Meanwhile, the external speaker controller 2 has the HDMI terminal and corresponds to the HDMI-CEC, but does not correspond to the Dolby Volume.

The control module 61 of the digital television broadcasting receiving device 1 detects a playback volume value (volume position) of the external speaker controller 2 by use of a volume position notification command of the HDMI-CEC. More specifically, the playback volume value of the external speaker controller 2 is detected by the following procedure:

1. the digital television broadcasting receiving device 1 performs a request to the external speaker controller 2 by means of the following command 1:

Opcode: <Give Audio Status> (0x71); and 2. the external speaker controller 2 receives the command 1 to respond to the digital television broadcasting receiving device 1 by means of the following command 2:

Opcode: <Report Audio Status> (0x7A)

Parameters: [Audio Status].

The parameter [Audio Status] is 1 byte data, and the detail is as follows:

Bit 7:0="Audio Mute Off"/Bit 7:1="Audio Mute On"

Bit 6-0: $0x00 \leq N \leq 0x64$

The volume value represented as Bit 6-0 is defined by the CEC specification as follows:

Used to indicate the current audio volume status of a device.

N indicates audio playback volume, expressed as a percentage (0%-100%). N=0 is no sound; N=100 is maximum volume sound level.

The linearity of the sound level is device dependent.

This value is mainly used for displaying a volume status bar on a TV screen.

Namely, the playback volume value obtained by the above command is a volume level with 101 levels of 0 to 100. The control module 61 of the digital television broadcasting receiving device 1 calculates a decibel value corresponding to the playback volume value detected by the above command.

For example, the nonvolatile memory 613 of the control module 61 stores a conversion table showing a correspondence relation between plural playback volume values and plural decibel values. For example, a decibel value M (N=0 to 70) corresponding to a playback volume value N (N=0 to 100) is described in the conversion table. The control module 61 calculates the decibel value corresponding to the detected playback volume value on the basis of the conversion table.

As another mentioned, the nonvolatile memory 613 of the control module 61 stores a first conversion table showing a first correspondence relation between plural playback volume values and plural decibel values and a second conversion table showing a second correspondence relation between plural playback volume values and plural decibel values. For example, the decibel value M (M=6 to 50) corresponding to the playback volume value N (N=0 to 100) is described in the first conversion table. Meanwhile, the decibel value M (M=30 to 90) corresponding to the playback volume value N (N=0 to 100) is described in the second conversion table. When the control module 61 selects the first conversion table on the basis of the operation information input from the operation module 71 or the operation information, input from the remote controller 72 through the receiving module 73, the control module 61 calculates a decibel value corresponding to the detected playback volume value on the basis of the first conversion table. When the control module 61 selects the second conversion table on the basis of the operation information input from the operation module 71 or the operation information, input from the remote controller 72 through the receiving module 73, the control module 61 calculates a decibel value corresponding to the detected playback volume value on the basis of the second conversion table.

Thus, plural conversion tables are stored in the nonvolatile memory 613, whereby it is possible to realize more faithful decibel conversion corresponding to characteristics of an external speaker controller. For example, when it is assumed that the item description (such as the website and the manual) of an external speaker controller A recommends that the first conversion table is used for the external speaker controller A, the first conversion table is used, that is, a user operates the remote controller 72 to select the first conversion table, whereby the playback volume value set in the external speaker controller A can be converted into a decibel value in a more faithful manner. Likewise, when it is assumed that the item description (such as the website and the manual) of an external speaker controller B recommends that the second conversion table is used for the external speaker controller 3, the second conversion table is used, that is, a user operates the remote controller 72 to select the second conversion table, whereby the playback volume value set in the external speaker controller B can be converted into a decibel value in a more faithful manner.

As another mentioned, when the nonvolatile memory 613 of the control module 61 stores a conversion table, which shows a correspondence relation between plural playback volume values and plural decibel values, for each vendor ID, for example the control module 61 of the digital television broadcasting receiving device 1 detects the vendor ID of the external speaker controller 2 in advance, using a vendor ID notification command of the HDMI-CEC. The control module 61 selects a conversion table corresponding to the detected vendor ID to calculate a decibel value corresponding to the detected playback volume value on the basis of the selected conversion table.

As described above, the control module 61 of the digital television broadcasting receiving device 1 calculates a decibel value corresponding to the detected playback volume value. Subsequently, the control module 61 generates a digital audio signal, corresponding to the obtained decibel value, from the digital audio signal supplied from the signal processing module 47, using the Dolby Volume function of the audio processing module 53 of the digital television broadcasting receiving device 1 to output the generated digital audio signal to the HDMI I/F (Interface) 87. The digital audio signal input into the HDMI I/F 87 is output to the external speaker controller (amplifier) 2 through the HDMI terminal 88. Further, a video based on the video signal corresponding to this audio signal is output to the video display device 57.

According to the above constitution, the digital television broadcasting receiving device 1 can bring the effect of the Dolby Volume to the external speaker controller 2 not complying with the Dolby Volume. As a result, the external speaker 3 can output audio in which a sense of incongruity due to the difference in content's volume level is eliminated and audio subjected to bandwidth correction in accordance with the playback volume value (audio volume).

For example, by virtue of HDMI-CEC association, the effect of the Dolby Volume and the like can be obtained while the volume, set in the external speaker controller 2, is changed by the remote controller 72 of the digital television broadcasting receiving device 1.

Next, the expansion of the Dolby Volume function is described with reference to FIG. 3.

The control module 61 of the digital television broadcasting receiving device 1 confirms whether the Dolby Volume function is effective (BLOCK 1). The control module 61 further confirms whether the output destination of an audio signal is the external speaker (BLOCK 2) and still further confirms whether the external speaker controller 2 corresponds to the HDMI-CEC function (BLOCK 3).

When the Dolby Volume function is effective (BLOCK 1, YES), the output destination of the audio signal is the external speaker (BLOCK 2, YES), and the external speaker controller 2 corresponds to the HDMI-CEC function (BLOCK 3, YES), the control module 61 detects the playback volume value (volume position) of the external speaker controller 2, using the volume position notification command of the HDMI-CEC (BLOCK 4). Further, the control module 61 calculates a decibel value corresponding to the playback volume value detected by use of the volume position notification command of the HDMI-CEC (BLOCK 5). Further, the control module 61 generates the audio signal corresponding to the obtained decibel value, using the Dolby Volume function of the audio processing module 53 to output the generated audio signal to the external speaker controller 2 through the HDMI terminal 88 (BLOCK 6).

Figure 4:
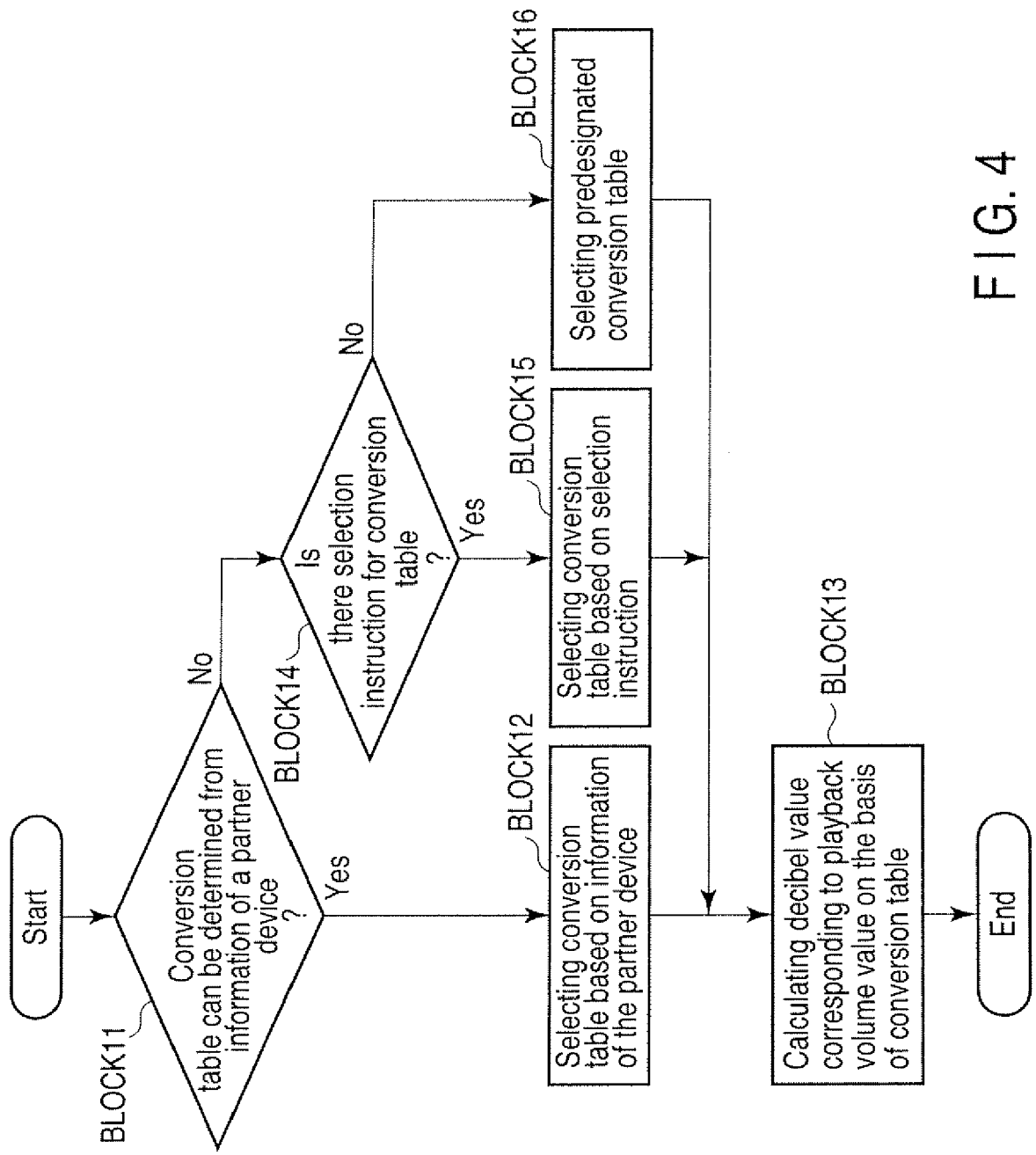
FIG. 4 is a flow chart for explaining calculation of a decibel value corresponding to a playback volume value based on a conversion table according to the embodiment.

The calculation of the decibel value, corresponding to the playback volume value, on the basis of the conversion table is described with reference to FIG. 4.

When the control module 61 can determine a conversion table from plural conversion tables stored in the nonvolatile memory 613, and, for example, when the vendor ID of the external speaker controller 2 is detected (BLOCK 11, YES), the conversion table corresponding to the vendor ID of the external speaker controller 2 is selected (BLOCK 12), and the decibel value corresponding to the playback volume value is calculated based on the selected conversion table (BLOCK 13).

When the control module 61 cannot determine a conversion table (BLOCK 11, NO), and when the control module 61 has received the user's selection instruction for the conversion table (BLOCK 14, YES), the control module 61 selects a conversion table, corresponding to the selection instruction, from the plural conversion tables stored in the nonvolatile memory 613 (BLOCK 15) to calculate the decibel value corresponding to the playback volume value on the basis of the selected conversion table (BLOCK 13).

When the control module 61 cannot determine a conversion table from the plural conversion tables stored in the nonvolatile memory 613 (BLOCK 11, NO), and when there is no user's selection instruction for the conversion table (BLOCK 14, NO), the control module 61 selects a predesignated conversion table from the plural conversion tables stored in the nonvolatile memory 613 (BLOCK 16) to calculate the decibel value corresponding to the playback volume value on the basis of the selected conversion table (BLOCK 13).

The above predesignated conversion table (hereinafter referred to as a designation conversion table) has high versatility to obtain a relatively favorable decibel conversion result in most of well-known external speaker controllers having various characteristics. The control module 61 may store the past usage history of the conversion tables in the nonvolatile memory 613 so that the designation conversion table is determined based on the past usage history of the conversion tables. Namely, a conversion table which was previously used may be determined as the designation conversion table, or the most frequently used conversion table may be determined as the designation conversion table.

The various modules of the device described herein can be implemented as software applications, hardware and/or software modules, or components on one or more computers, such as servers. While the various modules are illustrated separately, they may share some or all of the same underlying logic or code.

While certain embodiments of the invention have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A video/audio output device comprising an audio level difference correction function of outputting an audio signal which has a corrected audio level difference, comprising:
    a detection module configured to request a playback volume value of an external speaker controller for controlling an external speaker, to receive the playback volume value from the external speaker controller comprising no audio level difference correction function, by using a digital multimedia interface control function, and to detect the playback volume value set in the external speaker controller;
    a calculation module configured to calculate a decibel value corresponding to the playback volume value detected by the detection module;
    a generation module configured to generate an audio signal corresponding to the calculated decibel value;
    an audio signal output module configured to output the generated audio signal to the external speaker controller; and
    a video output module configured to output a video based on a video signal corresponding to the audio signal.

2. The video/audio output device of claim 1, wherein the calculation module calculates a decibel value corresponding to the playback volume value detected by the detection module on the basis of a conversion table showing a correspondence relation between a plurality of the playback volume values and a plurality of the decibel values.

3. The video/audio output device of claim 1, wherein the calculation module calculates a decibel value corresponding to the playback volume value detected by the detection module on the basis of a conversion table selected from one of a first conversion table showing a first correspondence relation between a plurality of the playback volume values and a plurality of the decibel values and a second conversion table showing a second correspondence relation between a plurality of the playback volume values and a plurality of the decibel values.

4. The video/audio output device of claim 1, wherein the detection module detects a vendor ID of the external speaker controller, and the calculation module calculates a decibel value corresponding to the playback volume value detected by the detection module on the basis of a conversion table, which is one of a plurality of conversion tables, showing a correspondence relation between a plurality of the playback volume values and a plurality of the decibel values, and corresponds to the vendor ID detected by the detection module.

5. A video/audio output method to be applied to a video/audio output device comprising an audio level difference correction function of outputting an audio signal which has a corrected audio level difference, comprising:

requesting a playback volume value of an external speaker controller for controlling an external speaker, receiving the playback volume value from the external speaker controller comprising no audio level difference correction function, by using a digital multimedia interface control function, and detecting the playback volume value set in the external speaker controller;

calculating a decibel value corresponding to the detected playback volume value;

generating an audio signal corresponding to the calculated decibel value; and outputting the generated audio signal to the external speaker controller, and, at the same time, outputting a video based on a video signal corresponding to the audio signal.

* * * * *